(12) United States Patent
Bittlestone

(10) Patent No.: US 9,482,718 B2
(45) Date of Patent: Nov. 1, 2016

(54) INTEGRATED CIRCUIT

(71) Applicant: Texas Instruments Incorporated, Dallas, TX (US)

(72) Inventor: Clive David Bittlestone, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 188 days.

(21) Appl. No.: 14/153,280

(22) Filed: Jan. 13, 2014

(65) Prior Publication Data

US 2015/0198664 A1    Jul. 16, 2015

(51) Int. Cl.
*G01R 31/28* (2006.01)
*G01R 31/317* (2006.01)
*G06F 11/22* (2006.01)

(52) U.S. Cl.
CPC ..... *G01R 31/31701* (2013.01); *G06F 11/2273* (2013.01)

(58) Field of Classification Search
CPC .. G06F 11/2273; G06F 11/26; G06F 11/261; G06F 11/267; G06F 11/2635; G06F 11/2236; G01R 31/31701; G01R 31/31813; G01R 31/318385; G01R 31/3167; G11C 29/50; G11C 29/44; G11C 29/10; G11C 29/20; B23K 1/018; B23K 2201/40
See application file for complete search history.

(56) References Cited

U.S. PATENT DOCUMENTS

| | | | | |
|---|---|---|---|---|
| 4,334,307 A * | 6/1982 | Bourgeois | ........... | G06F 11/2289 714/45 |
| 5,355,369 A * | 10/1994 | Greenberger | ......... | G06F 11/267 714/724 |
| 5,519,715 A * | 5/1996 | Hao | ........................ | G06F 11/26 714/30 |
| 5,537,331 A * | 7/1996 | Shinonaga | .......... | G06F 11/2273 324/73.1 |
| 5,677,913 A * | 10/1997 | Aybay | ................. | G06F 11/2236 714/720 |
| 5,748,640 A * | 5/1998 | Jiang | .................... | G06F 11/2236 714/720 |
| 5,914,968 A * | 6/1999 | Keeth | ................. | G06F 11/2273 714/721 |
| 5,954,824 A * | 9/1999 | Cherichetti | .... | G01R 31/318505 307/407 |
| 6,094,730 A * | 7/2000 | Lopez | ................... | G06F 11/261 714/28 |
| 6,249,889 B1 * | 6/2001 | Rajsuman | ........... | G06F 11/2236 714/718 |
| 6,249,893 B1 * | 6/2001 | Rajsuman | ...... | G01R 31/318385 714/738 |
| 6,408,412 B1 * | 6/2002 | Rajsuman | .......... | G01R 31/3167 714/724 |
| 6,571,359 B1 * | 5/2003 | Padwekar | .............. | B23K 1/018 714/30 |
| 6,643,800 B1 * | 11/2003 | Safford | ............... | G06F 9/30174 712/227 |
| 7,237,154 B1 * | 6/2007 | Zorian | ............ | G11C 29/56008 714/711 |
| 7,269,805 B1 * | 9/2007 | Ansari | .................... | G06F 11/27 716/136 |
| 2003/0120973 A1 * | 6/2003 | Hatakeyama | ........... | G06F 11/27 714/30 |
| 2004/0153925 A1 * | 8/2004 | Ronza | .................... | G11C 29/44 714/724 |
| 2006/0173670 A1 * | 8/2006 | Engel | ..................... | G06F 11/261 703/26 |
| 2007/0214398 A1 * | 9/2007 | Zhang | ............ | G01R 31/318371 714/728 |
| 2007/0220389 A1 * | 9/2007 | Sato | ................ | G01R 31/31921 714/733 |
| 2010/0146302 A1 * | 6/2010 | Schoegler | ........... | G06F 12/1433 713/193 |
| 2014/0053035 A1 * | 2/2014 | Harper | ................ | G06F 11/3089 714/733 |

\* cited by examiner

*Primary Examiner* — Guerrier Merant
(74) *Attorney, Agent, or Firm* — John R. Pessetto; Charles A. Brill; Frank D. Cimino

(57) ABSTRACT

Integrated circuits and methods for testing integrated circuits are disclosed herein. An embodiment of an integrated circuit includes a microprocessor and memory that is accessible by the microprocessor. The integrated circuit also includes reconfigurable logic, wherein a first test program for testing at least one of the microprocessor and memory is loadable onto the reconfigurable logic. At least one other program is loadable into the reconfigurable logic after the first test program runs.

20 Claims, 1 Drawing Sheet

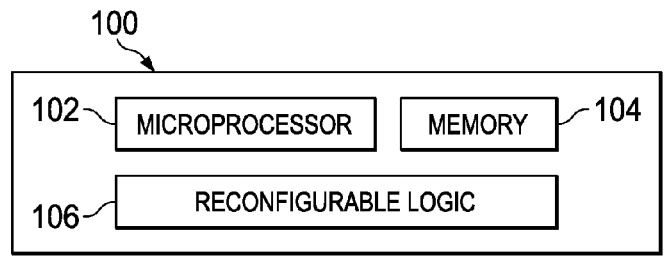
FIG. 1
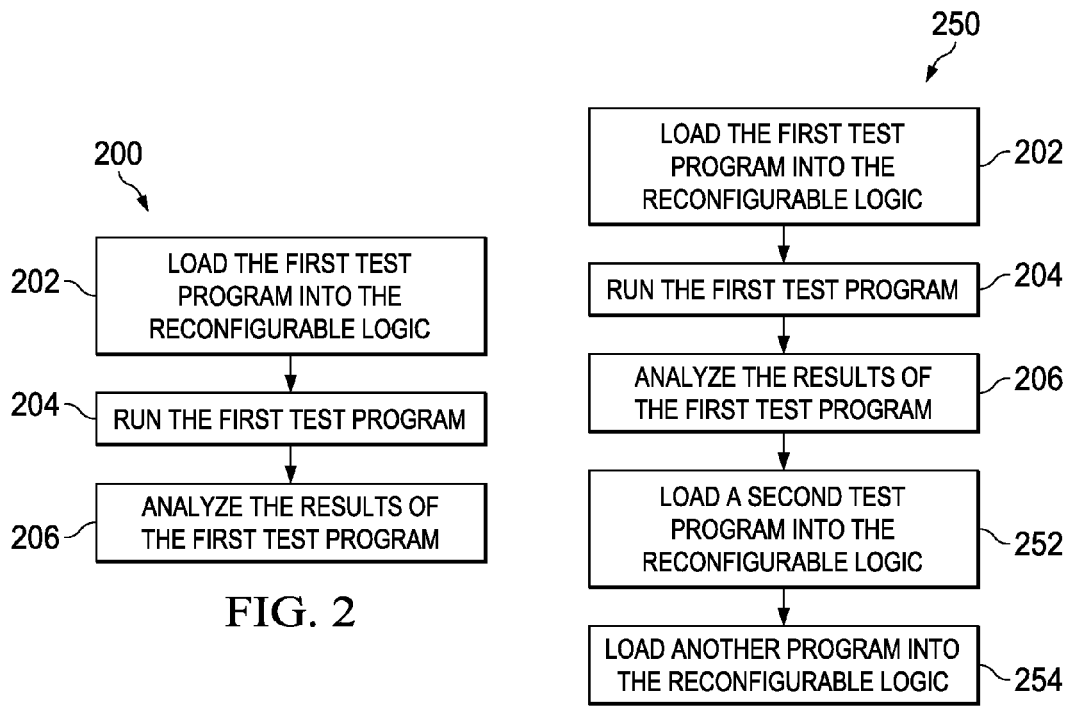
FIG. 2
FIG. 3
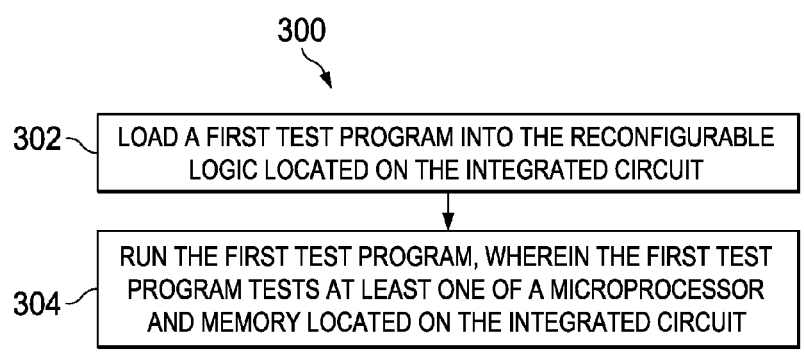
FIG. 4

INTEGRATED CIRCUIT

BACKGROUND

As integrated circuits (ICs) become more complex, the number of components on the ICs increases. This increase in the number of components requires that post production testing needs to be more extensive to test the greater number of components on the ICs. Portions of the post production tests are used to test gates and other components in the IC. One method of testing includes a first test that tests the components and a second test that tests user specific items on the IC. The user specific items may be programming or logic on the IC.

The ICs are fabricated with a portion of their area dedicated to post production testing. This portion of an IC is often referred to as "designed for test" logic or DFT logic. The DFT logic is initiated after production and executes instructions to perform tests on components in the IC and output results of the tests. The DFT logic may consume 10-20% of the area of an IC and is only used for post production testing purposes.

SUMMARY

Integrated circuits and methods for testing integrated circuits are disclosed herein. An embodiment of an integrated circuit includes a microprocessor and memory that is accessible by the microprocessor. The integrated circuit also includes reconfigurable logic, wherein a first test program for testing at least one of the microprocessor and memory is loadable onto the reconfigurable logic. At least one other program is loadable into the reconfigurable logic after the first test program runs.

BRIEF DESCRIPTION OF THE DRAWINGS

FIG. 1 is block diagram of an embodiment of an integrated circuit.

FIG. 2 is a flowchart describing an embodiment of a test procedure conducted on the IC of FIG. 1.

FIG. 3 is a flowchart describing an embodiment of a test procedure conducted on the IC of FIG. 2 wherein a second test program is loaded into the reconfigurable logic.

FIG. 4 is a flow chart describing an embodiment for testing an IC.

DETAILED DESCRIPTION

Integrated circuits (ICs) and methods of testing ICs are disclosed herein. The ICs have logic that performs tests on components in the ICs after production. This logic is sometimes referred to as "designed for test" logic or DFT logic. The DFT logic in conventional ICs is hardwired logic that consumes a portion of the area of an IC. Hardwired logic is logic that is fabricated into the IC and cannot be changed after fabrication. The ICs disclosed herein use reconfigurable logic as the DFT logic. Reconfigurable logic is sometimes referred to as reconfigurable computing, adaptive logic, and adaptive computing. Reconfigurable logic includes logic that can be rewired dynamically. Some embodiments of reconfigurable logic include logic circuits that are equipped with arrays of memory cells that can be programmed to perform hardware functions using software tools. In some embodiments, the reconfigurable logic is able to run programs based on the logic configuration. In some embodiments, the reconfigurable logic is used for other purposes after the testing is complete. The other purposes include debugging the IC, running customized code, repairing memory, and adding new functionality to the IC.

Conventional IC designers are reluctant to use reconfigurable logic on ICs because the reconfigurable logic is not very dense and uses a lot of the area of an IC. Therefore, it takes a relatively large amount of area of the IC to contain a relatively small number of gates and other elements used by reconfigurable logic. As described below, the reconfigurable logic on the ICs described herein is used for many purposes, so the area used by the reconfigurable logic is very dynamic and serves many purposes of the IC.

A block diagram of an embodiment of an IC 100 is shown in FIG. 1. The IC 100 includes a microprocessor 102, memory 104, and reconfigurable logic 106. The IC 100 does not include hardwired DFT logic because the DFT logic is programmed into the reconfigurable logic 106. In some embodiments, the DFT logic is a program that is able to be loaded into the reconfigurable logic 106. As described above, conventional ICs typically have a portion of their area dedicated to hardwired DFT logic. The microprocessor 102 is a conventional microprocessor. Likewise, the memory 104 may be conventional memory used by conventional ICs. The microprocessor 102, the memory 104, and the reconfigurable logic 106 all may communicate with each other by way of conventional data transmission techniques and devices (not shown).

The reconfigurable logic 106 is sometimes referred to as reconfigurable computing. The density of the reconfigurable logic 106 is not as high as conventional logic circuits or application specific integrated circuits. However, the reconfigurable logic 106 is able to be changed by "loading" a new logic circuit. Loading a new circuit is sometimes referred to as loading a new circuit onto the fabric of the reconfigurable logic 106.

The logic circuit that is loaded into the reconfigurable logic 106 is able to run code. In some embodiments, the code runs tests on the memory 104 and/or the processor 102. The tests are run after production of the IC 100 and serve as initial tests. In conventional ICs, the code for these tests is stored in the DFT logic portion of the conventional IC. One of the problems with the conventional DFT logic is that it is only used to test the conventional IC after production. The area of the conventional IC used for DFT logic is never used again. Therefore, conventional ICs include a fabricated area that serves a one-time purpose.

The reconfigurable logic 106 on the IC 100 of FIG. 1 performs the functions of conventional DFT logic in addition to many other functions. For example, after production of the IC 100, test code is loaded into the reconfigurable logic 106. More specifically, the reconfigurable logic 106 is configured to run test code, which is sometimes referred to as the first test code. In some embodiments, the code that is used to configure the reconfigurable logic to run the first test is input to the IC 100 from an external source. In other embodiments, the code to configure the reconfigurable logic 106 is stored in the IC 100. For example, the code may be input or fabricated into the IC 100 or the reconfigurable logic 106 during fabrication. In some embodiments, the code used to configure the reconfigurable logic 106 is stored in read only memory (ROM) that is located on the IC 100 or connectable to the IC 100.

After or as the first test is executed, data from the first test is output or otherwise made available for analysis. In some embodiments, the test results are analyzed by components in the IC 100 or by different code loaded onto the reconfigurable logic 106 that runs a second test. The first test may indicate that some components on the IC 100 are not functioning correctly. These components may be further analyzed by way of the second test or debug program that run on the reconfigurable logic 106.

An example of the steps to test the IC 100 are shown in the flowchart 200 of FIG. 2 and described as follows. The processes commences with loading the first test program into the reconfigurable logic 106 as shown in block 202. The first test program is code that configures the reconfigurable logic 106 to run the first test program. As described above, the first test program may be loaded from an external source or it may be stored on the IC. The first test program may also be initially fabricated into the reconfigurable logic 106 at the time that the IC 100 is fabricated.

In step 204, the first test program is run on the reconfigurable logic 106. An external instruction or an instruction from the microprocessor 102 can cause the first test program to start to execute. The first test program can test a multitude of different functions and components on the IC 100. For example, the first test program may test the speed of components, such as the microprocessor 102 and the memory 104. The first test program may also test analog values, such as the gain of amplifiers and the like. The first test program may also test the memory 104 to determine which bits are not working correctly and other portions of the memory 104 that are not working correctly. In some embodiments, the results of the first test are stored on the IC 100, such as in the memory 102. In other embodiments, the results of the first test are sent from the IC 100 to an external device (not shown), such as a test fixture.

At block 206, the results from the first test program are analyzed. The analysis of the results may be done at different locations and by different devices. In some embodiments, an external test device receives and analyzes the data. In other embodiments, the first test program analyzes the results. In these embodiments, the analysis is typically output from the IC 100 so that appropriate action can be taken on the IC 100. For example, the IC 100 may be determined to be a rejected device and may be discarded. In other embodiments described below, the IC 100 may be debugged and repaired.

In many embodiments, the reconfigurable logic 106 is no longer required for testing purposes. Therefore, in some embodiments, other programs are loaded into the reconfigurable logic 106 so that the area of the IC 100 used for the reconfigurable logic 106 is utilized.

The embodiments described above are some basic embodiments of the IC 100 using the reconfigurable logic 106. Other more complex embodiments will now be described. Reference is made to a flowchart 250 of FIG. 3 that shows some embodiments where a second test program is loaded into the reconfigurable logic 106. The flowchart 250 has the same blocks 202-206 as the flowchart 200 of FIG. 2. The flowchart 250 has a block 252 wherein the second test program is loaded into the reconfigurable memory 106.

In some embodiments, the second test program is loaded into the reconfigurable logic 106 in response to the analysis of the results of the first test program. In such embodiments, the second test program functions as a debug program. Depending on the results of the first test program, the second test program can repair memory bits, trim analog values, and swap pins on the IC 100. For example, if the first test program determined that some memory bits are not functioning, the second test program can cause the memory to use other memory bits instead of the defective bits. The second test program can set resistive and other values for such items as amplifier gains. If some pins are not functioning correctly, the second test program can cause their connections to be rerouted.

In some embodiments, the second test program is selected in response to the results of the first test program. For example, there may be several second test programs available or a single second test program with many modules. Thus, if memory bits are bad, a second test program that repairs the memory bits is loaded into the reconfigurable logic 106. Alternatively, the module of the second test program that repairs the memory bits is run.

After the second test program is run, another program is loaded into the reconfigurable logic as shown in block 254. The other program may perform a plurality of different functions and may come from different sources. For example, the other program may be loaded from an external source or be loaded from ROM located on the IC 100.

Many different programs may be loaded into the reconfigurable logic 106 or a single program with a plurality of different modules may be loaded. The different types of programs include programs for customizing the IC 100 to specific functions. For example, if the IC 100 is used in a camera, the program may cause the microprocessor to perform specific functions related to the model of camera in which the IC 100 is used. The reconfigurable logic may also be used to update existing programs with new features.

In some embodiments, the reconfigurable logic 106 can be switched at boot or dynamically while the microprocessor 102 is operating. An example of an IC 100 switching the reconfigurable logic 106 is an embodiment wherein the IC 100 is used in a device that plays music and takes pictures. When the device is being used to listen to music, the reconfigurable logic 106 is loaded with an audio decoder. When the device is used to take pictures, the reconfigurable logic 106 is loaded with an image compressor. The use of the reconfigurable logic 106 enables the device to have both the audio decoding engine and the compression engine on the chip, but without having both running simultaneously.

A method for testing a circuit is shown by the flowchart 300 of FIG. 4. The method begins at step 302 with loading a first test program into reconfigurable logic located on the integrated circuit. The method continues at step 304 with running the first test program, wherein the first test program tests at least one of a microprocessor and memory located on the integrated circuit.

While illustrative and presently preferred embodiments of integrated circuits have been described in detail herein, it is to be understood that the inventive concepts may be otherwise variously embodied and employed and that the appended claims are intended to be construed to include such variations except insofar as limited by the prior art.

What is claimed is:
1. An integrated circuit comprising:
a microprocessor;
memory that is accessible by the microprocessor; and
reconfigurable logic, wherein the reconfigurable logic is operable to be reconfigured by loading a new logic circuit onto a fabric of the reconfigurable logic, wherein the reconfigurable logic is operable to be reconfigured by a first test program for testing at least one of the microprocessor and memory, and wherein the reconfigurable logic is operable to be reconfigured by at least one other program after the first test program runs.
2. The integrated circuit of claim 1, wherein the first test program is stored on the integrated circuit by dynamically rewiring the reconfigurable logic.

3. The integrated circuit of claim 1, wherein the first test program tests components in the microprocessor.

4. The integrated circuit of claim 1, wherein the first test program tests components in the memory.

5. The integrated circuit of claim 1, wherein the first test program configures the reconfigurable logic to generate results of the testing and analyze the results.

6. The integrated circuit of claim 1, wherein a second test program for testing the integrated circuit is loadable into the reconfigurable logic in response to testing by the first test program.

7. The integrated circuit of claim 6, wherein the second test program is storable on the integrated circuit.

8. The integrated circuit of claim 1, wherein the first test program finds errors and wherein a second test program is loaded into the reconfigurable logic in response to the errors, and wherein the second test program repairs at least one of the errors.

9. The integrated circuit of claim 1, wherein the first test program finds at least one component that needs to be adjusted and wherein a second test program is loaded into the reconfigurable logic in response to the adjustment need, and wherein the second test program adjusts the at least one component.

10. The integrated circuit of claim 1, wherein a program that operates in conjunction with the microprocessor is loaded into the reconfigurable logic by dynamically rewiring the reconfigurable logic after the first test program has run.

11. A method of testing an integrated circuit, the method comprising:
    loading a first test program into reconfigurable logic located on the integrated circuit, wherein the reconfigurable logic is operable to be reconfigured by loading a new logic circuit onto a fabric of the reconfigurable logic, wherein the loading of the new logic circuit includes dynamically rewiring logic circuitry of the fabric of the reconfigurable logic, and wherein the reconfigurable logic is operable to be reconfigured by loading the first test program and a second test program; and
    running the first test program, wherein the first test program tests at least one of a microprocessor and memory located on the integrated circuit.

12. The method of claim 11, wherein the integrated circuit includes memory and wherein running the first test program includes performing at least one test on the memory.

13. The method of claim 11, further comprising storing the first test program on the integrated circuit.

14. The method of claim 11 and further comprising:
    analyzing results generated by the first test program;
    loading the second test program into the reconfigurable logic in response to the analysis of results of the first test program; and running the second test program.

15. The method of claim 14, wherein the second test program repairs at least one component found to be faulty by analysis of the results of the first test program.

16. The method of claim 14, wherein the first test program measures a value of at least one component on the integrated circuit and wherein the second test program adjusts the value of the at least one component.

17. The method of claim 11, wherein the first test program configures the reconfigurable logic to repair at least one component found to be faulty by the first test program.

18. The method of claim 11, wherein the first test program configures the reconfigurable logic to measure a value of at least one component on the integrated circuit and to adjust the value of the at least one component.

19. The integrated circuit of claim 11 further comprising running a program that operates in conjunction with the microprocessor on the reconfigurable logic after the first test program has run.

20. A method of testing an integrated circuit, the method comprising:
    loading a first test program into reconfigurable logic located on the integrated circuit, wherein the reconfigurable logic is reconfigured by loading a new logic circuit onto a fabric of the reconfigurable logic and dynamically rewiring the reconfigurable logic, and wherein the reconfigurable logic is reconfigured by loading the first test program;
    running the first test program, wherein the first test program tests at least one of a microprocessor and memory located on the integrated circuit;
    loading a second test program into the reconfigurable logic in response to the first test program, wherein the reconfigurable logic is reconfigured by loading a new circuit for the second test program onto the fabric of the reconfigurable logic; and
    running the second test program, wherein the second test program fixes at least one component identified by the first test program.

* * * * *